United States Patent [19]

Shido

[11] Patent Number: 5,682,104
[45] Date of Patent: Oct. 28, 1997

[54] ELECTRON BEAM TESTER AND TESTING METHOD USING THE SAME

[75] Inventor: Mahito Shido, Kawasaki, Japan

[73] Assignee: Kabushiki Kaisha Toshiba, Kawasaki, Japan

[21] Appl. No.: 385,874

[22] Filed: Feb. 9, 1995

[30] Foreign Application Priority Data

Feb. 10, 1994 [JP] Japan ..................... 6-016730

[51] Int. Cl.$^6$ ..................... G01R 31/305
[52] U.S. Cl. ..................... 324/751; 324/765
[58] Field of Search ..................... 324/751, 158.1, 324/765

[56] References Cited

U.S. PATENT DOCUMENTS

| | | | |
|---|---|---|---|
| 4,065,212 | 12/1977 | Belleson et al. | 356/398 |
| 4,649,324 | 3/1987 | Guerra et al. | 315/370 |
| 4,706,019 | 11/1987 | Richardson | 324/751 |
| 4,807,159 | 2/1989 | Komatsu et al. | 364/524 |
| 5,046,110 | 9/1991 | Carucci et al. | 382/149 |
| 5,164,666 | 11/1992 | Wolfgang et al. | 324/751 |
| 5,528,156 | 6/1996 | Ueda et al. | 324/751 |

FOREIGN PATENT DOCUMENTS

| | | |
|---|---|---|
| A-0 226 494 | 6/1987 | European Pat. Off. . |
| A-0 504 944 | 9/1992 | European Pat. Off. . |
| A-2 592 958 | 7/1987 | France . |

OTHER PUBLICATIONS

IEICE Transactions on Electronics, vol. E77-C, No. 4, Apr. 1994, pp. 546-551, Nakamae et al., "Efficient Dynamic Fault Imaging by Fully Utilizing CAD . . . System".
Meeting the Tests of Time, Aug. 29, 1989, Institute of Electrical Engineers, pp. 923-927, Talbot et al., "A Logic Analyzer Tool that Cuts E-Beam . . . Times".
Electron Microscopy 1986, vol. 1 Non-Biology (I), Kyoto, Aug. 31-Sep. 7, 1986, Tamama et al., pp. 181-184, "Fully Automated Electron Beam Tester Combined . . . Database".
Microelectronic Engineering, vol. 12, No. 1, May 1, 1990, pp. 81-86, "High Speed Dynamic Fault Imaging".

*Primary Examiner*—Kenneth A. Wieder
*Assistant Examiner*—Russell M. Kobert
*Attorney, Agent, or Firm*—Foley & Lardner

[57] ABSTRACT

In the present invention, a signal is input to a device by the device input apparatus, a trigger signal is input to the electron beam tester, and a wiring pattern of the layout obtained from design data is displayed on the display. A beam is applied onto a predetermined measurement point in the wiring while operating the device by the irradiation means, and the amount of secondary electrons emitted from the irradiated measurement point is detected by the detector. The potential at the measurement point, which corresponds to the amount of the secondary electrons detected, calculated from the calculation means (not shown), and the potential data obtained from this calculation is displayed being superimposed on the wiring pattern of the layout.

4 Claims, 5 Drawing Sheets

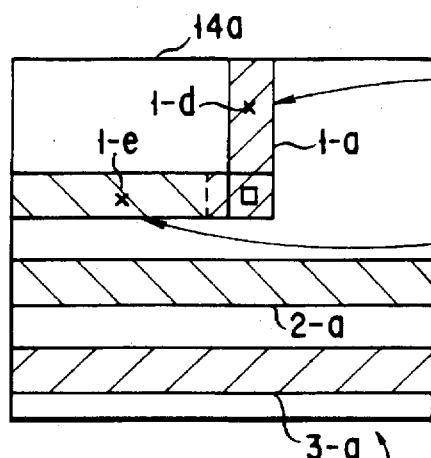 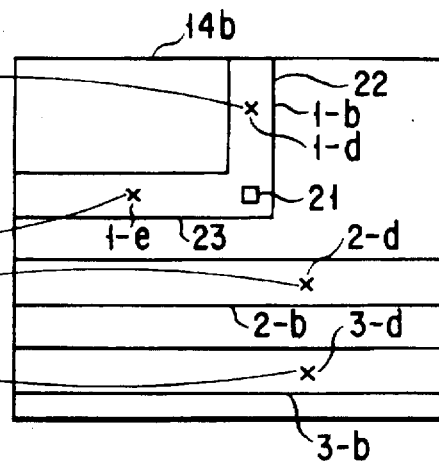
FIG. 6A    FIG. 6B
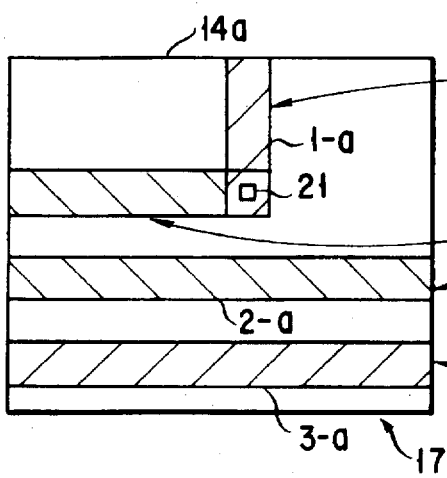 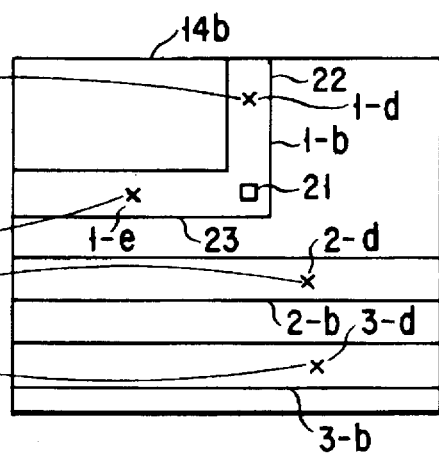
FIG. 7A    FIG. 7B
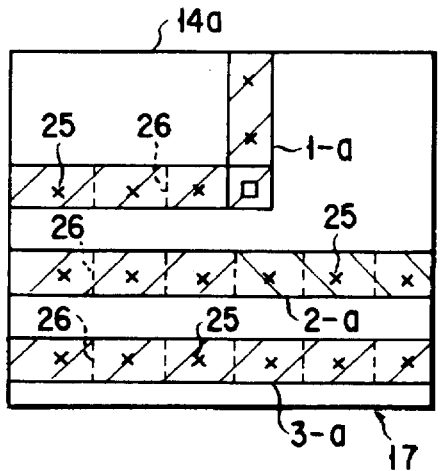 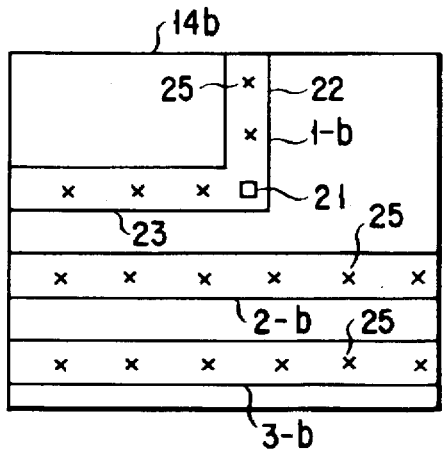
FIG. 8A    FIG. 8B

ELECTRON BEAM TESTER AND TESTING METHOD USING THE SAME

BACKGROUND OF THE INVENTION

1. Field of the Invention

The present invention relates to an electron beam tester used for obtaining a potential contrast image inside a device, which is synchronous with the operation of the device.

2. Description of the Related Art

A conventional electron beam tester consists of a sample chamber of a mirror cylinder, a device input apparatus, a display and EB (electron beam) tester controller and the like. Inside the sample chamber, a sample stage for placing a sample and a detector for detecting secondary electrons, etc. are provided.

FIG. 1 is a diagram showing an electron beam irradiation point in a timing repetition cycle when a potential contrast image which is synchronous with the operation of the device is obtained by using the conventional electron beam tester. A method of observing a change in potential at a predetermined point on a device, along with the elapse of time, using the conventional electronic beam tester will be described with reference to this figure.

First, a sample device is placed on the sample stage of the sample chamber. After that, an input signal is input to this device, and a trigger signal for synchronizing the operation of the device with the electron beam tester is input to the electron beam tester. Next, one pulse of an electron beam is irradiated on a specific point of the device once for every cycle period shown in FIG. 1, and the phase of an electron beam with respect to the trigger signal is changed for every cycle. During the irradiation, secondary electrons are released out of the electron-beam irradiated portion, and the released secondary electrons are detected by a detector. With the detection of the amount of secondary electrons, the difference in size of the device, the difference in substance, the difference in potential and the like are measured. Thus, a change in potential at a particular point along with the lapse of time can be observed.

The first method of obtaining a potential contrast image which is synchronous with the operation of the device with use of the conventional electron beam tester will now be described.

With the device input apparatus, an input signal is input to the device, and a trigger signal for synchronizing the beam tester with the operation of the device, is input to the electron beam tester. Next, 1 pulse of an electron beam shown in FIG. 1 is irradiated on the device so as to detect the amount of secondary electrons for one pixel, and this operation is repeated for all the pixels. Thus, a potential contrast image synchronized with the device operation can be obtained as an image of an SEM (scanning electronic microscope).

Time t required for obtaining one potential contrast image with the above first method is as indicated by formula (1) below. More specifically, time t is a product of the number, n, of pixels for obtaining data of a potential, i.e. the number, n, of pixels for one contrast image, the number of times, s, of obtaining data for one pixel, and a cycle period T of the device operation.

$$t = n \times s \times T \quad (1)$$

For example, where n=412×512=262144 (points), s=10 (times) and T=1 (ms), t=2621.44 (sec). That is, it takes about 43.7 minutes to obtain one contrast image having one side of 512 points.

In order to use the potential contrast image for analyzing the trouble of a device, images of both normal operation and erroneous operation must be compared with each other. Therefore, a plurality of potential contrast images must be obtained. As a result, the fact that it takes a very long time to obtain an image creates a problem in practice.

In order to compare the images between the normal operation and the erroneous operation, the difference between potential contrast images obtained in the image processing (the first method) is measured. In this case, a plurality of potential contrast images are different from each other in position, magnification, degree of distortion and the like, and therefore it is very difficult to effect matching among the contrast images at a high accuracy. More specifically, with the contrast images for a certain magnification, a difference in point may occur in matching magnifications, creating a difference in the accuracy of position, a distortion of an image is created by the influence of an electric field due to potential variation of wiring, and the degree of distortion differs from one place to another. It is very difficult to achieve the matching at a high accuracy. As a result, an error may occur in specifying a position due to the matching error.

FIG. 2 is a diagram showing a timing of a static state maintained in a timing cycle period for obtaining a potential contrast image by use of the conventional electron beam tester.

The second method of obtaining a potential contrast image which is synchronous with the operation of a device will be described with reference to this figure.

A device is maintained in a specific static state 1 in one repetitious period shown in FIG. 2. Next, while maintaining this state, a pulse electron beam is irradiated by the two-dimensional scanning on a specific area in the device, that is, the entire area in which a contrast image is required to be obtained. Next, secondary electrons are generated from the irradiated section, and the amount of the secondary electrons is detected by the detector. Thus, the data for one potential contrast image is obtained, and a spatial distribution of potential can be observed.

The potential contrast image obtained by the second method merely expresses a specific static state of the device, and is generally different from that obtained by the first method since the phase between points on which electron beams are irradiated in the second method differs from that of the first method. Consequently, the potential contrast image obtained by the second method cannot be used for analysis of a transition state during the operation of the device.

Further, the second method cannot be applied to a device which cannot be maintained at a specific static state.

With the conventional electron beam tester, the detection of the amount of secondary electrons generated upon the irradiation of an electron beam must be carried out the same number of times as the total number of pixels. As a result, a potential contrast image which is synchronous with the operation of the device cannot be obtained in a short period of time. Particularly, in the case where a plurality of potential contrast images should be obtained, it requires a great amount of time, and accordingly it takes a great amount of time to perform a trouble analysis, creating a problem in terms of practical operation.

In comparison of images obtained in both normal and erroneous operations, a plurality of potential contrast images differ in position, magnification and degree of distortion. As a result, it is difficult to effect the matching among these contrast images at a high accuracy.

SUMMARY OF THE INVENTION

The object of the present invention is to provide an electron beam tester capable of obtaining a potential contrast image which is synchronous with the high-speed operation of a device and effecting the matching among contrast images of the device at high accuracy, and further to provide a testing method using such an electron beam tester.

The object of the present invention can be achieved by an electron beam tester comprising:

signal input means for inputting a predetermined signal to a device;

first display means for displaying a wiring pattern of a layout obtained from design data, on a display;

irradiating means for irradiating an electron beam on an arbitrary measurement point of the wiring pattern while operating the device;

detecting means for detecting an amount of secondary electrons emitted from the measurement point irradiated with the electron;

operation means for calculating a potential of the measurement point corresponding to the amount of the secondary electrons detected by the detecting means; and second display means for superimposing potential data obtained by the operation means on the wiring pattern of the layout, and displaying a superimposed image.

A test method using an electron beam tester comprising the steps of:

inputting a predetermined signal to a device;

displaying a wiring pattern of a layout obtained from design data, on a display;

irradiating an electron beam on an arbitrary measurement point on the wiring pattern while operating the device;

detecting an amount of secondary electrons emitted from the irradiated measurement point;

calculating a potential of the measurement point, which corresponds to the amount of secondary electrons detected; and superimposing data of the potential obtained in the calculating step, on the wiring pattern of the layout and displaying a superimposed data.

In the present invention, a predetermined signal is input to a device from the signal inputting means, and a wiring pattern of a layout obtained from design data is displayed on a display by the first display means. Then, an electron beam is irradiated on an arbitrary measurement point of the wiring by the irradiation means while operating the device, and the amount of the secondary electrons emitted from the irradiated measurement point is detected by the detection means. The potential at the measurement point, which corresponds to the amount of the secondary electrons detected, is calculated by the operation means. The potential of the measurement point can be regarded as the potential of the wiring pattern which includes the measurement point. That is, it is theoretically considered that the potential is the same at any points of the wiring. Consequently, the potential of the entire region of the wiring pattern can be displayed by measuring the potential of only the measurement point and superimposing the potential data on the wiring pattern of the layout. Thus, a potential contrast image which is synchronous with the high-speed operation of the device can be obtained in a short time.

Further, the potential contrast images are obtained by superimposing potential data on the wiring pattern of the layout. Therefore, a difference in potential accuracy due to magnification, a difference in the degree of distortion from one place to another, and an error between a plurality of images do not occur when potential contrast images are compared and processed. Thus, with the present invention, it is possible to effect the matching between contrast images at a high accuracy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 6A and 6B are diagrams illustrating the second testing method of a device, using the electron beam tester according to the second embodiment of the present invention;

FIGS. 7A and 7B are diagrams illustrating the third testing method of a device, using the electron beam tester according to the third embodiment of the present invention;

FIGS. 8A and 8B are diagrams illustrating the fourth testing method of a device, using the electron beam tester according to the fourth embodiment of the present invention;

DETAILED DESCRIPTION OF THE PREFERRED EMBODIMENTS

Embodiments of the present invention will now be described with reference to accompanying drawings.

Figure 1:
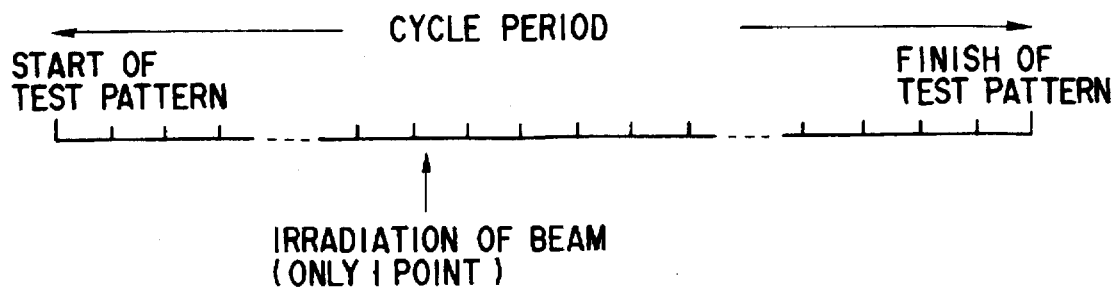
FIG. 1 is a diagram showing an electron beam irradiation point in a timing repetition cycle when a potential contrast image which is synchronous with the operation of the device is obtained by using a conventional electron beam tester.
Figure 2:
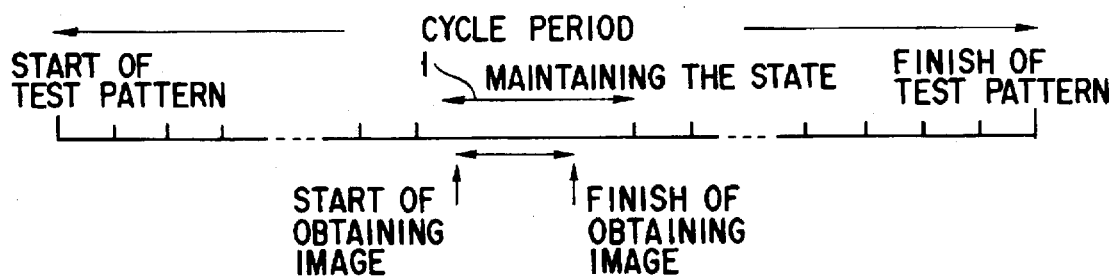
FIG. 2 is a diagram showing a timing of a static state maintained in a timing cycle period for obtaining a potential contrast image by use of the conventional electron beam tester.
Figure 3:
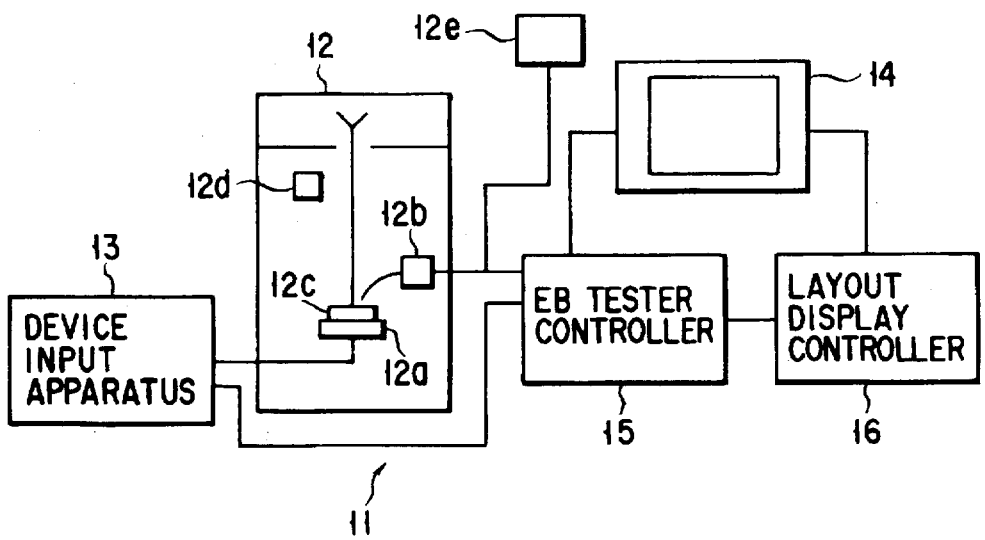
FIG. 3 is a diagram showing a structure of an electron beam tester according to first to eighth embodiments of the present invention.

FIG. 3 is a diagram showing the structure of an electron beam tester according to the first to eighth embodiments of the present invention. An electron beam tester 11 consists of a sample chamber 12 made of a mirror cylinder, a device input apparatus 13, a display 14, an EB tester controller 15, a layout display controller 16 and the like. The layout display controller 16 has first and second display means (not shown).

In the sample chamber 12, a sample stage 12a on which a sample (device) 12c is placed, a detector 12b for detecting a secondary electron, and irradiation means 12d for irradiating an electron beam are provided. The sample stage 12 is connected to the device input apparatus 13, which is further connected to the EB tester controller 15. The EB tester controller 15 is connected to the detector 12b and the operating means 12e, and the EB tester controller 15 is connected to the layout display controller 16. The layout display controller 16 is connected to the display 14 and the EB tester controller 15 is connected to the display 14.

Figure 4:
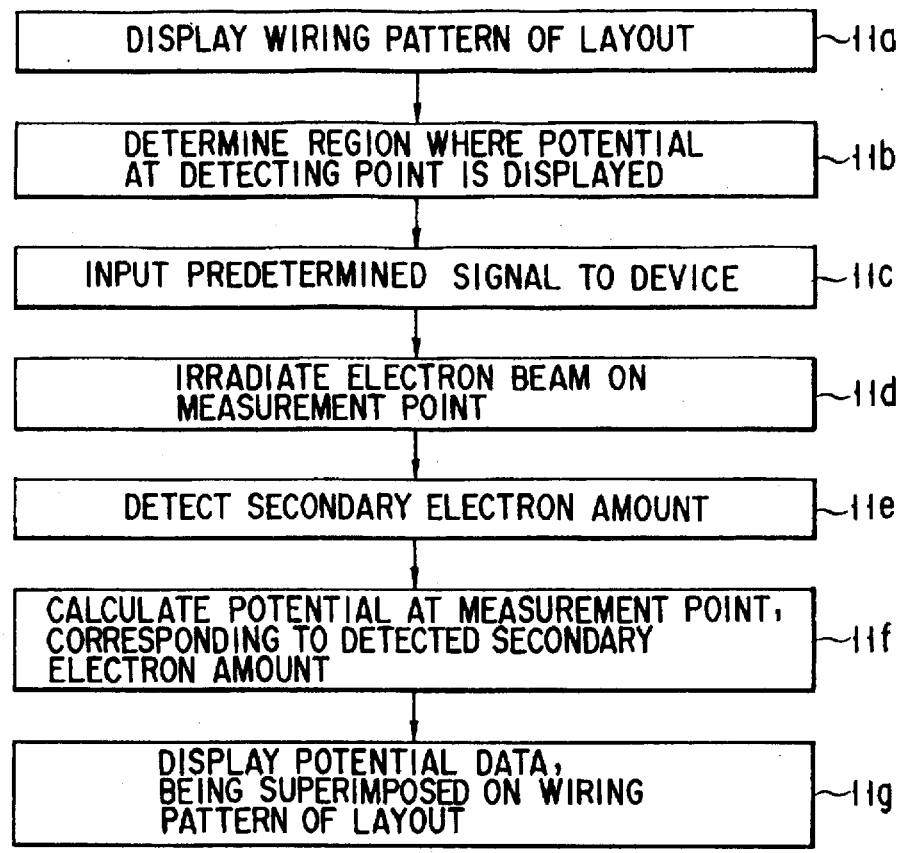
FIG. 4 is a flowchart illustrating a procedure of a testing method using the electron beam tester according to the first embodiment of the present invention.
Figures 5A, 5B:
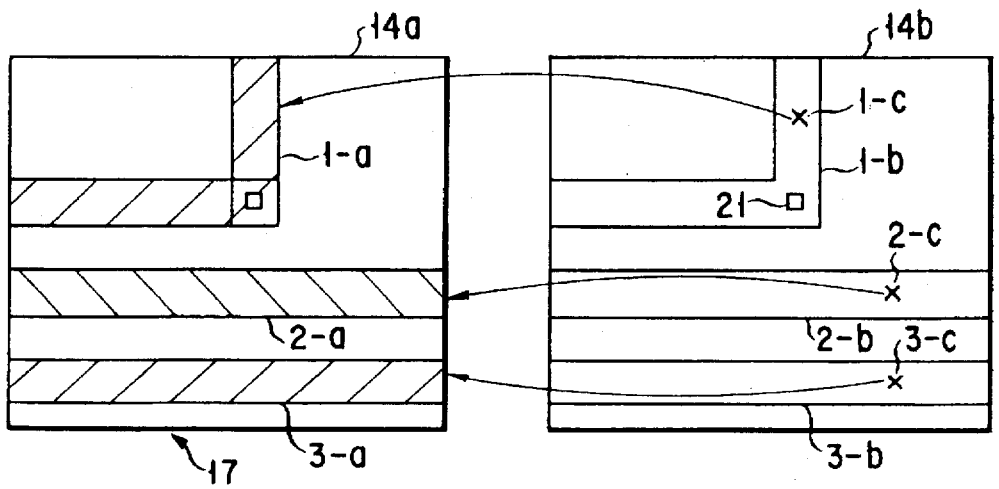
FIGS. 5A and 5B are diagrams illustrating the first testing method of a device, using the electron beam tester according to the first embodiment of the present invention.

FIG. 4 is a flowchart illustrating the procedure of the testing method using the electron beam tester according to the first embodiment of the present invention. FIGS. 5A and 5B are designed to illustrate the first testing method for a device, using the electron beam tester shown in FIG. 3, and are images displayed on the display while the test is being conducted.

First, a sample semiconductor device 12c is placed on the sample stage 12a of the sample chamber 12. Then, as shown in FIG. 4, the wiring pattern of the layout is displayed by the first display means (step 11a). That is, as shown in FIG. 5A, regions each including a node to be measured, for example, first to third wiring patterns 1-a to 3-a, are displayed on the layout display screen 14a of the display 14, by the layout display controller 16 using layout data formed by a CAD (computer aided design) or the like.

As shown in FIG. 5B, first to third wiring patterns 1-b to 3-b of the device 12c, which are regions that respectively correspond to the wiring patterns 1-a to 3-a of the semiconductor device 12c, having the above layout, and observed by an SEM or the like, are displayed on the real device display screen 14b of the display 14.

After that, in the wiring patterns 1-b to 3-b of the device 12c, points where potentials are measured, i.e. secondary electron amount detecting points 1-c to 3-c, where the amount of secondary electrons are detected, are chosen. More specifically, the first secondary electron amount detecting point 1-c is chosen in the first wiring pattern 1-b, the second secondary electron amount detecting point 2-c is chosen in the second wiring pattern 2-b, and the third secondary electron amount detecting point 3-c is chosen in the third wiring pattern 3-b.

Next, as shown in FIG. 4, regions in which the potentials at detected points are displayed, are determined by the layout display controller 16 (step 11b). That is, the regions where the potentials measured at the first to third detection points 1-c to 3-c shown in FIG. 5B are displayed, are determined on the layout display screen 14a. More specifically, the potential measured at the first detection point 1-c is indicated over the entire region of the first wiring pattern 1-a in the layout display screen 14a by means for distinguishing the region from the other part, for example, hatching, color or brightness. This is because it is considered that all points within the first wiring pattern 1-b are theoretically at the same potential since wiring layers of this wiring pattern are connected with each other via a contact portion 21. Thus, all the wiring layers included in the first wiring pattern 1-b are at the same potential. Similarly, potentials measured at the second and third detection points 2-c and 3-c are indicated within the entire regions of the second and third detection points 2-c and 3-c in the layout display screen 14a. It is also possible that the real device image and the layout are aligned with each other for positional alignment, a measurement position is designated on the real image or the layout, and that measurement point on the display region or the real device which corresponds to the measurement position is chosen.

After that, as shown in FIG. 4, a predetermined signal is input to the device (step 11c). More specifically, an input signal is input to the semiconductor device 12c from the device input apparatus 13 which is controlled by the EB tester controller 15 shown in FIG. 3. A trigger signal is generated by the device input apparatus 13 and supplied to the electron beam test controller 15. While maintaining this state, an electron beam is irradiated on the measurement point as illustrated in FIG. 4 (step 11d). In detail, one pulse of an electron beam, which is regulated at a certain timing for one cycle period of the trigger signal by the EB tester controller 15, is applied on the first detection point 1-c in the device 12c by the irradiation means 12d once. Upon the irradiation, secondary electrons of the specific phase of the irradiated detection point are emitted from that point 1-c, and the secondary electrons emitted are detected by the detector 12b. That is, the amount of the secondary electrons are detected, as illustrated in FIG. 4 (step 11e). Next, the potential at the measurement point which corresponds to the amount of the secondary electrons detected is calculated by the calculating means 12e (step 11f). The first potential at the first detection point 1-c is measured.

Then, as illustrated in FIG. 4, potential data is superimposed on the wiring pattern of a layout and displayed on the display by the layout display controller 16 (step 11g). Specifically, the first potential is indicated by a predetermined region, i.e. the first hatched area, the entire region of the first wiring pattern 1-a in the layout display screen 14a shown in FIG. 5A.

After that, in a similar manner as above, an electron beam is applied on each of the second and third detection points, and the secondary electrons emitted are detected by the detector 12b. The second and third potentials thus measured are indicated by the second and third hatched areas provided for the entire regions of the second and third wiring patterns 2-a and 3-a on the layout display screen 14a. Consequently, the potential states of the first to third wiring patterns 1-a and 3-a, at particular phases, are displayed on the layout display screen 14a, thus obtaining a potential contrast image 17. It is also possible that all the measurements above are carried out and all the resulting data are displayed on the layout display screen.

Then, the potential state of the device 12c at a particular phase in a regular operation is calculated by simulation, thus forming the potential contrast image. As the potential contrast image of an error-free case is compared with the obtained potential contrast image 17, the trouble of the device 12c is analyzed, and the location of the trouble is specified.

In the first embodiment above, one secondary electron amount detection point is designated in wiring layers which are considered to have the same potential, and the amount of the secondary electrons emitted from this detection point is measured. The potential of the wiring layers is measured from the secondary electron amount. However, it is also possible that a plurality of secondary electron amount detecting points are designated in wiring layers which are considered to have the same potential, the secondary electron amounts at the detection points are measured, and the potential of the wiring layers is obtained from the average of the secondary electron amounts. In the case where an average of secondary electron amounts at a plurality of detection points is taken as above, the reliability of the potential value obtained can be improved.

In the above embodiment, points where potentials are measured are designated on the wiring patterns 1-b to 3-b of the device 12c, and the measurement results are displayed in the corresponding regions in the layout display screen 14a. It is also possible that points where potentials are measured are designated on the wiring patterns 1-b to 3-b of the layout, and the measurement results of the corresponding points on the device are displayed in the corresponding regions in the layout display screen 14a.

In the first embodiment, it is considered that the first wiring pattern 1-b shown in FIG. 5B is at the same potential at any point, and therefore this potential is displayed as shown in FIG. 5A as the potential of the entire region of the first wiring pattern 1-b, with the measurement of the potential of only the first detection points 1-c. Further, with the present invention, the measurement of the regions other than the wiring portions, which are conventionally and inevitably measured although unnecessary, is not required. Therefore, the number of points where potentials are measured can be reduced significantly as compared with the conventional art. Consequently, the synchronization of the operation of a device with a potential contrast image can be achieved, and the time period for obtaining potential contrast images which can be used for the analysis of a transient state can be shortened remarkably as compared to the conventional art. For example, with the present invention, a potential contrast image can be obtained from three potentials measured at 3 points, out of 262124 points (512×512), which is the number of pixels for one contrast image. Specifically, the time required for obtaining a potential contrast image can be shortened to 3/262124 of that of the conventional art. Therefore, the efficiency of the trouble analysis of the device 12c using the potential contrast image can be significantly improved.

In the first embodiment, potential data measured are superimposed on the wiring patterns, 2-a and 3-a of the layout, thus obtaining a potential contrast image. Consequently, a difference in accuracy of position, a difference in degree of distortion from one place to another and errors between a plurality of images, and the like do not result when comparing and processing the potential contrast images of the normal and erroneous operations. Therefore, it is possible to effect the matching among a plurality of images at a high accuracy. Thus, the location of the trouble in the device 12c can be accurately specified.

FIGS. 6A and 6B are diagrams designed to illustrate the second testing method for a device, in which the electron beam tester according to the second embodiment is used, and show images displayed on the display during the test. In FIGS. 6A and 6B, the same elements as those shown in FIGS. 5A and 5B are designated by the same reference numerals, and only the sections different from those of the first embodiment will be described.

In the first to third wiring patterns 1-b to 3-b of the device 12c, points of measurement of potentials, i.e. the secondary electron amount detection points 1-d and 1-e are designated. Specifically, the first and second secondary electron amount detection points 1-d and 1-e are designated in the first wiring pattern 1-b. The reason for taking two points, detecting points 1-d and 1-e, is that a lower wiring layer 22 and an upper wiring layer 23 included in the first wiring pattern 1-b are connected via the contact portion 21. In the second wiring pattern 2-b, the third secondary electron amount detecting point 2-d is designated, and in the third wiring pattern 3-b, the fourth secondary electron amount detecting point 3-d is designated.

Next, regions which indicate the potentials measured at the first to fourth detecting points 1-d to 3-d and 1-e are designated on the layout display screen 14a. The potential measured at the first detection point 1-d is indicated by the hatched region on the first detection point 1-d side of the first wiring pattern 1-a, defined by the border taken at the mid-point of the wire length between the first and second detecting points 1-d and 1-e in the layout display screen 14a, whereas the potential measured at the second detection point 1-e is indicated by the hatched region on the second detection point 1-e side defined by the border taken at the mid-point of the wire length. Each of the potentials measured at the third and fourth detecting points 2-d and 3-d is indicated by a specific hatched area of the entire region of the respective one of the second and third wiring patterns 2-a and 3-a in the layout display screen 14a.

In the above second embodiment, an effect similar to that of the first embodiment can be obtained.

In this embodiment, there are two secondary electron amount detecting points in the first wiring pattern 1-b, and therefore, for example, if a disconnection occurs at the contact portion 21 which connects the lower wiring layer 22 and the upper wiring layer 23 together, the disconnection can be easily found, and the location of the disconnection can be specified.

FIGS. 7A and 7B are diagrams designed to illustrate the third testing method for a device, in which the electron beam tester according to the third embodiment is used, and show images displayed on the display during the test. In FIGS. 7A and 7B, the same elements as those shown in FIGS. 6A and 6B are designated by the same reference numerals, and only the sections different from those of the second embodiment will be described.

The potential measured at the first detection point 1-d is indicated by the hatched region on the first detection point 1-d side of the first wiring pattern 1-a, defined by the border taken at the contact portion 21, whereas the potential measured at the second detection point 1-e is indicated by the hatched region on the second detection point 1-e side of the first wiring pattern 1-a, defined by the border taken at the contact portion 21.

In the above third embodiment, an effect similar to that of the second embodiment can be obtained.

FIGS. 8A and 8B are diagrams designed to illustrate the fourth testing method for a device, in which the electron beam tester according to the fourth embodiment is used, and show images displayed on the display during the test. In FIGS. 8A and 8B, the same elements as those shown in FIGS. 5A and 5B are designated by the same reference numerals, and only the sections different from those of the first embodiment will be described.

As shown in FIG. 8B, a plurality of secondary electron amount detecting points 25 are designated at predetermined intervals or at the same interval in each of the first to third wiring patterns 1-b to 3-b of the device 12c in the real device display screen 14b. Or the secondary electron amount detecting points 25 are designated by node names.

The potential measured at each detecting point 25 is indicated by the hatched region in the wiring patterns 1-a to 3-a where that detecting point 25 is present, defined by the border 26 taken at the mid-point of a pair of detection points 25 in the layout display screen 14a.

In the above fourth embodiment, an effect similar to that of the first embodiment can be obtained.

Further, a plurality of detecting points 25 are designated in each of the first to third wiring patterns 1-b to 3-b, and therefore a disconnection between detecting points 25 can be detected.

Figures 9A, 9B:
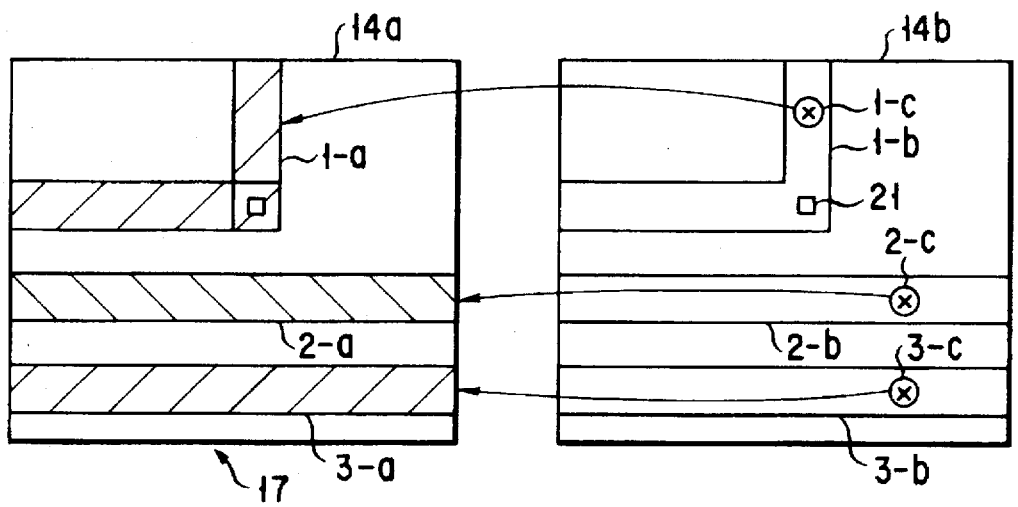
FIGS. 9A and 9B are diagrams illustrating the fifth testing method of a device, using the electron beam tester according to the fifth embodiment of the present invention.

FIGS. 9A and 9B are diagrams designed to illustrate the fifth testing method for a device, in which the electron beam tester according to the fifth embodiment is used, and show images displayed on the display during the test. In FIGS. 9A and 9B, the same elements as those shown in FIGS. 5A and 5B are designated by the same reference numerals, and only the sections different from those of the first embodiment will be described.

In this embodiment, when an electron beam is applied on either one of the secondary electron amount detecting points 1-c to 3-c, the diameter of the electron beam is increased by focusing, or the control of the beam current. In other words, the diameter of the electron beam is increased by defocusing or increasing the beam current.

In the above fifth embodiment, an effect similar to that of the first embodiment can be obtained.

Further, since the diameter of the electron beam is increased, an influence on specific data due to the shape of a local section including a certain point on the wiring layer can be reduced. In this case, when the beam current is increased so as to increase the beam diameter, the total beam current amount is increased as compared to the case of the first embodiment. Consequently, the S (signal)/N (noise) ratio can be increased. Thus, the reliability can be improved as in the case of the enhancement of the reliability of the potential data, in which potentials are measured at a plurality of detecting points and these potentials are averaged. In short, in the present invention, it is not necessary to take an average of potentials. Consequently, the time required for observing a potential can be shortened as compared to the case the reliability is increased.

Meanwhile, when the defocusing is carried out, the diameter of the beam is increased, and the beam current amount per unit area is decreased. Consequently, the time required to charge up the protection film is prolonged. Therefore, the influence on the specific data due to the shape of a local section, can be reduced.

Figures 10A, 10B:
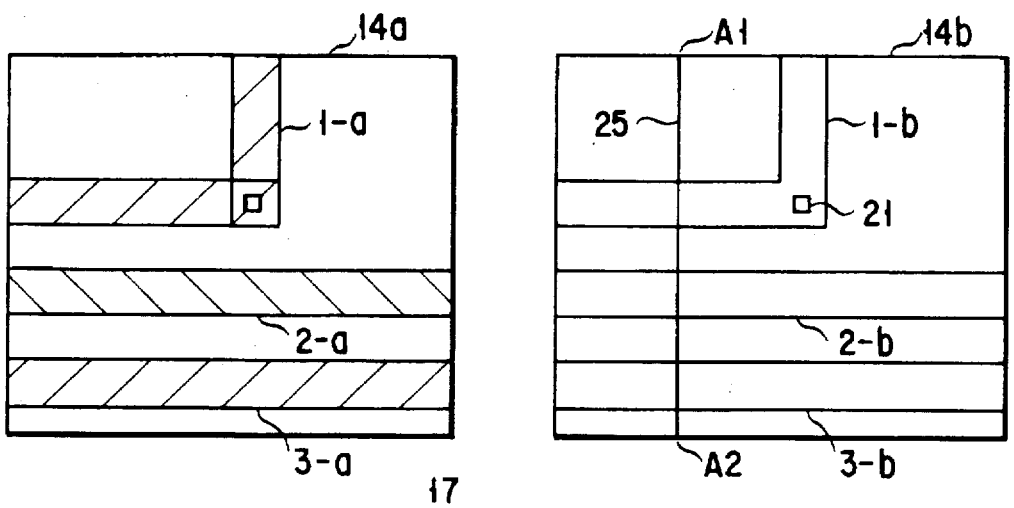
FIGS. 10A, 10B and 10C are diagrams illustrating the sixth testing method of a device, using the electron beam tester according to the sixth embodiment of the present invention.
Figure 10C:
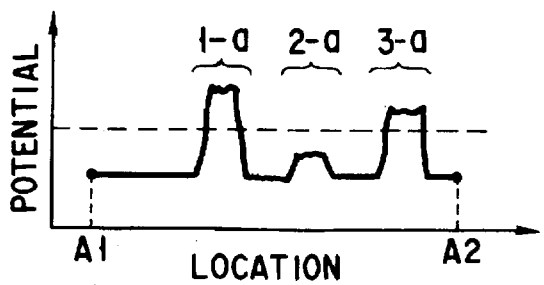

FIGS. 10A and 10B are diagrams designed to illustrate the sixth testing method for a device, in which the electron beam tester according to the sixth embodiment is used, and show images displayed on the display during the test. FIG. 10C illustrates a profile of a potential measured on the line connecting point $A_1$ and $A_2$ shown in FIG. 10B. In FIGS. 10A and 10B, the same elements as those shown in FIGS. 5A and 5B are designated by the same reference numerals, and only the sections different from those of the first embodiment will be described.

As shown in FIG. 10B, a plurality of secondary electron amount detecting points are designated on the line connecting points $A_1$ and $A_2$ to each other on the real device display screen 14b.

Those potentials of the plurality of detecting points measured at detecting points located on the first to third wiring patterns 1-b to 3-b are averaged separately for each pattern, and the average values are displayed in the respective regions of the wiring patterns 1-a to 3-a of the layout as shown in FIG. 10C. That is, with regard to the potentials measured at those of the detecting points 25 which are located on the first wiring pattern 1-b, the average value obtained from the potentials is indicated by hatching provided in the region of the first wiring pattern 1-a. The average values of the potentials measured at the detecting points 25 located on the second and third wiring patterns 2-b and 3-b are displayed in the same manner as above.

In the above sixth embodiment, an effect similar to that of the first embodiment can be obtained.

Further, in this embodiment, electron beams are applied on the line connecting points $A_1$ and $A_2$, and therefore the time required to charge up the protection film can be prolonged. Consequently, the influence on the specific data due to the shape of a local section, can be reduced.

Figure 11A:
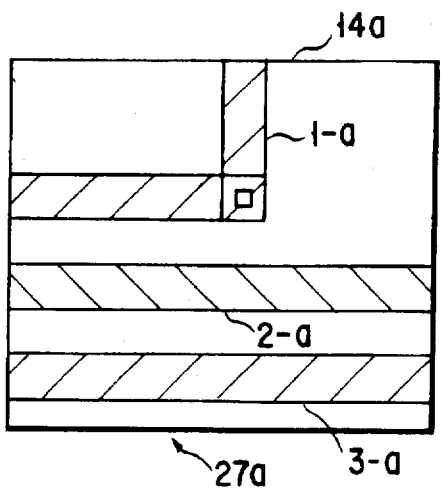
FIGS. 11A, 11B, 11C and 11D are diagrams illustrating the seventh testing method of a device, using the electron beam tester according to the seventh embodiment of the present invention.
Figure 11B:
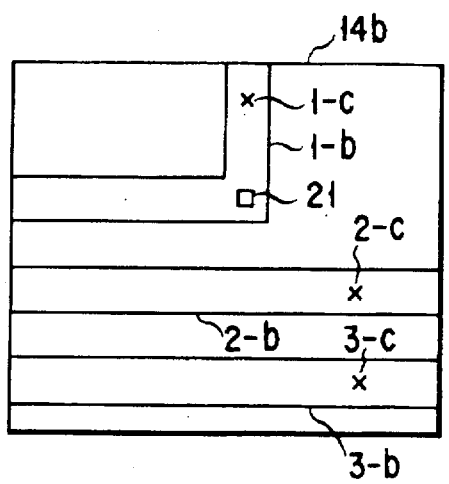

FIGS. 11A and 11B are diagrams designed to illustrate the seventh testing method for a device, in which the electron beam tester according to the seventh embodiment is used, and the same elements as those shown in FIGS. 5A and 5B are designated by the same reference numerals, and only the sections different from those of the first embodiment will be described.

Figure 11C:
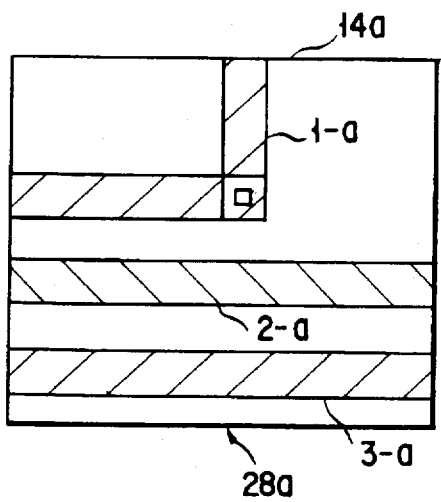
Figure 11D:
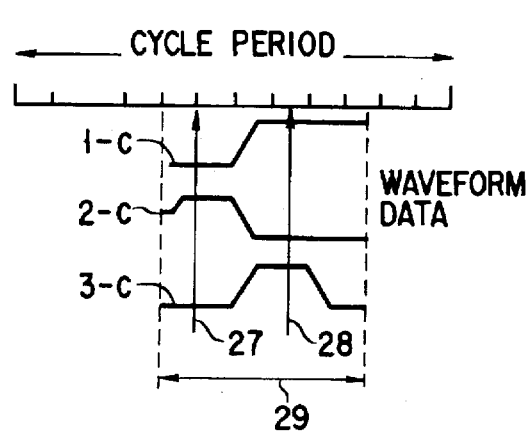

On each of the first to third secondary electron amount detecting points 1-c to 3-c on the semiconductor device 12c shown in FIG. 11B, one pulse of an electron beam is irradiated once for every cycle period at a predetermined time zone 29 of the cycle period shown in FIG. 11D. While applying the beam, secondary electrons are emitted from the irradiated detecting points 1-c to 3-c, and the emitted secondary electrons are detected by the detector 12b shown in FIG. 3. Next, for every cycle period, a pulse electron beam is applied at a different timing in the time zone 29. Thus, a change in potential at each of the detecting points 1-c to 3-c along with time is observed. From this observation results, waveform data of each of the detecting points 1-c to 3-c in the predetermined time zone 29 shown in FIG. 11D can be obtained.

Then, a potential contrast image 27a at the first timing 27 of the cycle period obtained from the waveform data by the layout display controller 16 shown in FIG. 3, is displayed on the layout display screen 14a shown in FIG. 11A. Similarly, a potential contrast image 28a at the second timing 28 of the cycle period obtained from the waveform is displayed on the layout display screen 14a shown in FIG. 11C.

In the seventh embodiment, an effect similar to that of the first embodiment can be obtained.

Further, in this embodiment, a change in logic state along with time can be observed on the layout display screen 14a, using the waveform data obtained at the first to third detecting points 1-c to 3-c.

It should be noted that waveform data is obtained by repeating one irradiation of one pulse electron beam for every cycle period, a plurality of times; however, it is also possible to obtain waveform data by continuously irradiating an electron beam. In this case, waveform data can be obtained with a beam irradiation of one cycle period, and therefore the time required to obtain the waveform data can be further shortened.

Figure 12:
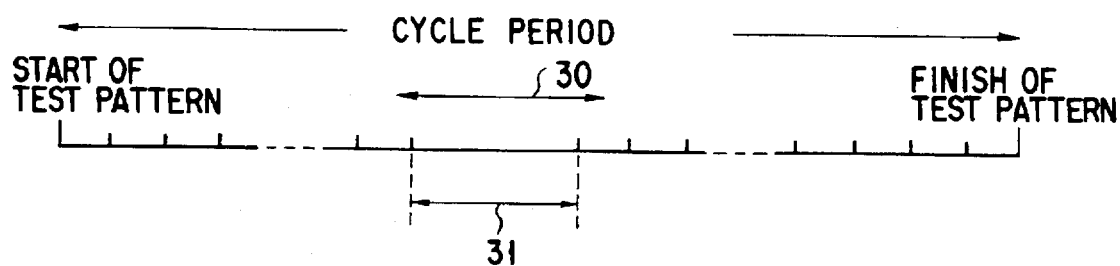
FIG. 12 is a diagram illustrating a timing of a static state maintained in a timing cycle period for obtaining a potential contrast image by use of the electron beam tester according to the eighth embodiment of the present invention.

FIG. 12 is a diagram illustrating a timing of the static state maintained in the cycle period, for obtaining a potential contrast image using the electron beam tester according to the eighth embodiment of the present invention. A method of obtaining a potential contrast image which is synchronous with the operation of a device will be described with reference to this figure.

The device is maintained at a certain static state 30 during one cycle period shown in FIG. 12. Next, while maintaining this state 30, an electron beam is irradiated on a secondary electron amount detecting point of the device, which is a representative measurement point for measuring a potential in a predetermined time zone of a cycle period. Then, the amount of secondary electrons emitted from the irradiated portion during the time zone 31 is detected. Thus, the data of the potential contrast image in the state 30 can be obtained.

In the eighth embodiment, an effect similar to that of the first embodiment can be obtained, and specifically, the time required to obtain a potential contrast image can be shortened as compared to the conventional art.

It should be noted that an electron beam is applied on a representative measurement point only in the predetermined time zone 31 of a cycle period; however it is also possible that an electron beam is continuously applied and secondary electrons are detected only in the predetermined time zone 31. Thus, the observation of the normal state can be made quick and the time for maintaining the device in the static state 30 can be shortened.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An electron beam tester comprising:

signal input means for inputting a predetermined signal to a device;

first display means for displaying a wiring pattern of a layout obtained from design data, on a display;

second display means for displaying an image of a wiring pattern of the device, said image of a wiring pattern being related to said wiring pattern displayed by said first display means;

irradiating means for irradiating an electron beam to a measurement point which is determined in accordance with said image of a wiring pattern displayed by said second display means;

detecting means for detecting an amount of secondary electrons emitted from said measurement point irradiated with the electron beam;

calculation means for calculating a potential of said measurement point corresponding to the amount of secondary electrons detected by said detecting means; and data processing means for displaying a specific indication to said wiring pattern, based on the potential calculated by the calculation means, including an area corresponding to said measurement point displayed by said first display means.

2. An electron beam tester according to claim 1, wherein said measurement point is plural.

3. An electron beam tester comprising:

signal input means for inputting a predetermined signal to a device;

first display means for displaying a wiring pattern of a layout obtained from design data, on a display;

second display means for displaying an image of a wiring pattern of the device, said image of a wiring pattern being related to said wiring pattern displayed by said first display means;

irradiating means for irradiating an electron beam to a measurement point which is determined in accordance with said image of a wiring pattern displayed by said second display means;

detecting means for detecting an amount of secondary electrons emitted from the measurement point irradiated with the electron beam;

calculation means for calculating a potential of said measurement point corresponding to the amount of the secondary electrons detected by said detecting means; and data processing means for processing data obtained by said calculation means and corresponding data of a layout wiring pattern of said device prepared in advance, and setting a potential distribution based on a continuous wiring region obtained by the processed data to said wiring pattern of said layout displayed by said first display means.

4. An electron beam tester according to claim 3, wherein said measurement point is plural.

* * * * *